United States Patent
Ui et al.

(10) Patent No.: US 9,583,360 B2
(45) Date of Patent: Feb. 28, 2017

(54) SUBSTRATE PROCESSING APPARATUS AND SUBSTRATE PROCESSING METHOD

(75) Inventors: Akio Ui, Tokyo (JP); Hisataka Hayashi, Yokohama (JP); Keisuke Kikutani, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 895 days.

(21) Appl. No.: 13/424,952

(22) Filed: Mar. 20, 2012

(65) Prior Publication Data

US 2012/0228263 A1 Sep. 13, 2012

Related U.S. Application Data

(63) Continuation of application No. PCT/JP2009/004960, filed on Sep. 29, 2009.

(51) Int. Cl.
| | |
|---|---|
| *C23C 16/00* | (2006.01) |
| *C23F 1/00* | (2006.01) |
| *H01L 21/306* | (2006.01) |
| *H01L 21/311* | (2006.01) |
| *H01J 37/32* | (2006.01) |

(52) U.S. Cl.
CPC .... *H01L 21/31116* (2013.01); *H01J 37/32091* (2013.01); *H01J 37/32146* (2013.01); *H01J 37/32174* (2013.01)

(58) Field of Classification Search
USPC ... 156/345.43–345.47; 118/715, 722, 723 R, 118/723 E; 315/111.21
See application file for complete search history.

(56) References Cited

U.S. PATENT DOCUMENTS

| | | | | |
|---|---|---|---|---|
| 3,935,451 | A | * | 1/1976 | Janes ............................ 250/283 |
| 5,130,003 | A | * | 7/1992 | Conrad ......................... 204/176 |
| 5,460,684 | A | * | 10/1995 | Saeki et al. .............. 156/345.51 |
| 5,777,863 | A | * | 7/1998 | Kowalevskii et al. ......... 363/63 |
| 8,821,744 | B2 | * | 9/2014 | Ui et al. ......................... 216/71 |

(Continued)

FOREIGN PATENT DOCUMENTS

| | | |
|---|---|---|
| CN | 101499399 A | 8/2009 |
| JP | 8-264509 | 10/1996 |

(Continued)

OTHER PUBLICATIONS

Office Action issued by the State Intellectual Property Office of the People's Republic of China on Feb. 20, 2014, for Chinese Patent Application No. 200980161197.4, and English-language translation thereof.

(Continued)

*Primary Examiner* — Rakesh Dhingra
(74) *Attorney, Agent, or Firm* — Finnegan, Henderson, Farabrow, Garrett & Dunner LLP

(57) ABSTRACT

In one embodiment, a substrate processing apparatus, includes: a chamber; a first electrode disposed in the chamber; a second electrode disposed in the chamber to face the first electrode, and to hold a substrate; an RF power supply to apply an RF voltage with a frequency of 50 MHz or more to the second electrode; and a pulse power supply to repeatedly apply a voltage waveform including a negative voltage pulse and a positive voltage pulse of which delay time from the negative voltage pulse is 50 nano-seconds or less to the second electrode while superposing on the RF voltage.

8 Claims, 8 Drawing Sheets

(56) References Cited

U.S. PATENT DOCUMENTS

| | | | |
|---|---|---|---|
| 2006/0144518 A1* | 7/2006 | Kaji | H01J 37/32082 |
| | | | 156/345.43 |
| 2008/0241420 A1* | 10/2008 | Dhindsa et al. | 427/569 |
| 2009/0127101 A1* | 5/2009 | Nauman | C23C 14/3485 |
| | | | 204/192.26 |
| 2009/0194508 A1 | 8/2009 | Ui et al. | |
| 2009/0230089 A1* | 9/2009 | Bera et al. | 216/67 |

FOREIGN PATENT DOCUMENTS

| | | |
|---|---|---|
| JP | 10-4085 | 1/1998 |
| JP | 2004-76069 | 3/2004 |
| JP | 2009-187975 | 8/2009 |

OTHER PUBLICATIONS

Notification of Transmittal of Translation of the International Preliminary Report on Patentability for International Application No. PCT/JP2009/004960, mailed Apr. 26, 2012.
International Preliminary Report on Patentability for International Application No. PCT/JP2009/004960, issued Apr. 17, 2012.
Written Opinion of the International Search Authority related to International Application No. PCT/JP2009/004960, mailed Nov. 10, 2009, for Kabushiki Kaisha Toshiba.
International Search Report from Japanese Patent Office for International Application No. PCT/JP2009/004960, mailed Nov. 10, 2009.
Office Action issued by the Korean Patent Office on Aug. 29, 2013, for Korean Patent Application No. 2012-7005182, and English-language translation thereof.

* cited by examiner

_US 9,583,360 B2_

SUBSTRATE PROCESSING APPARATUS AND SUBSTRATE PROCESSING METHOD

CROSS-REFERENCE TO RELATED APPLICATION

This application is a continuation application of prior International Application No. PCT/JP2009/004960 filed on Sep. 29, 2009; the entire contents of all of which are incorporated herein by reference.

FIELD

Embodiments described herein relate generally to a substrate processing apparatus and a substrate processing method using plasma.

BACKGROUND

In a parallel-plate type substrate processing apparatus, plasma is generated by applying RF (radio frequency) to one of a pair of electrodes, and a substrate (Wafer) placed on the electrode to which the RF is applied or on the other electrode is processed by this plasma.

Here, an art in which a positive voltage in a pulse state is applied as a bias to suppress a charge up damage and a local abnormal etching (notching) is disclosed.

However, it turns out that it is not necessarily possible to perform an effective process even if the positive voltage in the pulse state is applied.

DETAILED DESCRIPTION

In one embodiment, a substrate processing apparatus includes: a chamber; a first electrode disposed in the chamber; a second electrode disposed in the chamber to face the first electrode and to hold a substrate; an RF power supply to apply an RF voltage with a frequency of 50 MHz or more to the second electrode; and a pulse power supply to repeatedly apply a voltage waveform including a negative voltage pulse and a positive voltage pulse of which delay time from the negative voltage pulse is 50 nano-seconds or less to the second electrode while superposing on the RF voltage.

(Configuration of Substrate Processing Apparatus)

Figure 1:
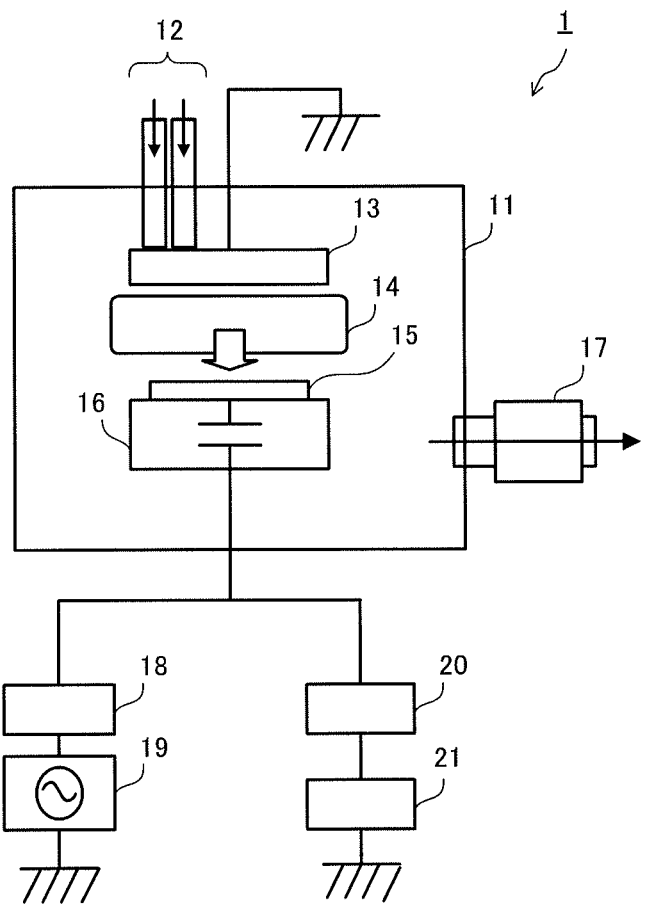
FIG. 1 is a schematic configuration chart of a substrate processing apparatus 1 according to an embodiment.

FIG. 1 is a schematic configuration chart of a substrate processing apparatus 1 according to an aspect of the embodiments. This substrate processing apparatus 1 is a parallel-plate type RIE (Reactive Ion Etching) apparatus.

A wafer (substrate) 15 is an object to be processed of the substrate processing apparatus 1 according to the present embodiment. An etching chamber 11 holds an environment necessary for the process of the wafer 15. A process gas introducing pipe 12 introduces process gas required for the process of the wafer 15. It is possible to appropriately use $SF_6$, $CF_4$, $C_2F_6$, $C_4F_8$, $C_5F_8$, $C_4F_6$, $Cl_2$, HBr, $SiH_4$, $SiF_4$, and so on in addition to gas such as Ar, Kr, Xe, $N_2$, $O_2$, CO, $H_2$ as the process gas.

A lower electrode 16 includes an electrostatic chuck to hold the wafer 15. An upper electrode 13 is provided to face an upper part of the lower electrode 16, and one end thereof is a ground potential. The upper electrode 13 and the lower electrode 16 constitute a parallel-plate electrode.

A plasma 14 is generated by an RF applied to the lower electrode 16. Ions forming the plasma 14 are incident in an arrow direction in FIG. 1, namely on the wafer 15. In this substrate processing apparatus 1, the wafer 15 is etched by using the plasma 14.

An exhaust port 17 is connected to a not-illustrated pressure regulating valve and exhaust pump. Gas in the etching chamber 11 is exhausted from the exhaust port 17, and thereby, a pressure in the etching chamber 11 is kept constant. An RF power supply 19 generates an RF voltage applied to the lower electrode 16. A frequency of the RF voltage is 50 MHz or more. Note that details thereof are described later. A matching device 18 matches an impedance between the RF power supply 19 and the plasma 14.

Figure 2:
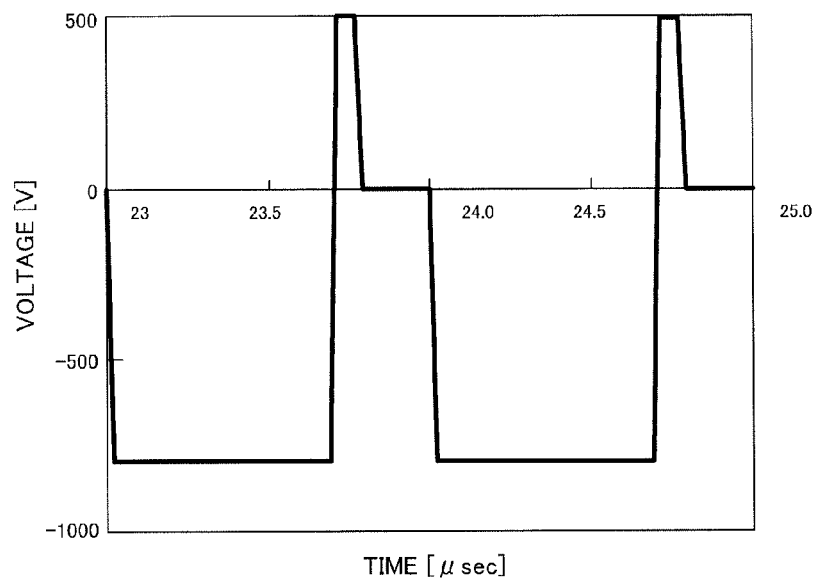
FIG. 2 is a view illustrating an example of a combined pulse waveform.

A pulse power supply 21 outputs, for example, a voltage waveform illustrated in FIG. 2 (a combined pulse waveform) to an LPF 20. A vertical axis and a horizontal axis of a graphic chart in FIG. 2 respectively represent a voltage (Voltage) and a time (μs).

As illustrated in FIG. 2, in the combined pulse waveform, a waveform in which a negative voltage pulse and a positive voltage pulse are combined is periodically repeated. The negative voltage pulse and the positive voltage pulse are each a voltage waveform in a rectangular wave shape of which voltage in one pulse (a peak voltage) is approximately constant. Note that details thereof are described later.

Figure 3:
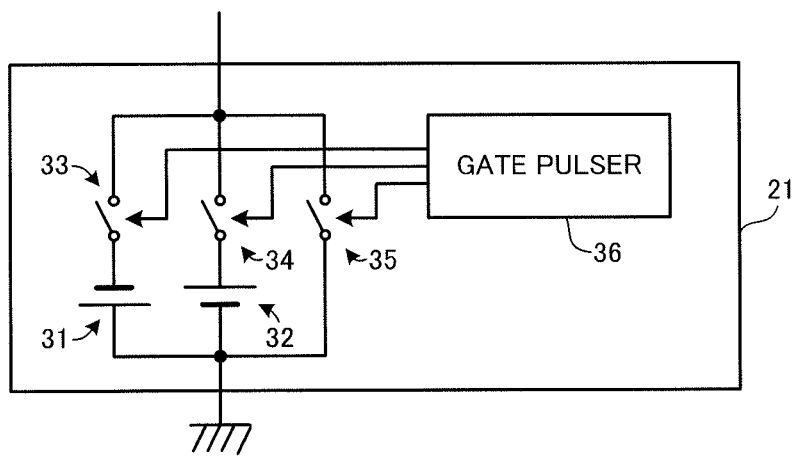
FIG. 3 is a schematic diagram illustrating an example of an internal configuration of a pulse power supply 21.

FIG. 3 is a schematic diagram illustrating an example of an internal configuration of the pulse power supply 21. In this example, the pulse power supply 21 includes DC power supplies 31, 32, switches 33 to 35, and a gate pulser 36.

The DC power supplies 31, 32 are power supplies of the negative voltage and the positive voltage. The DC power supply 31 functions as a first power supply having a first voltage corresponding to a peak voltage of the negative voltage pulse. The DC power supply 32 functions as a second power supply having a second voltage corresponding to a peak voltage of the positive voltage pulse.

The switches 33 to 35 are controlled by the gate pulser 36, and each of them are used to apply the negative voltage, the positive voltage, and the ground potential. The switch 33 functions as a first switch switching a connection state of the first power supply to an output end. The switch 34 functions as a second switch switching a connection state of the second power supply to the output end. The switch 35 functions as a third switch switching a connection state of the ground potential to the output end.

The gate pulser 36 controls switching of the switches 33 to 35, and functions as a controlling part controlling the first to third switches. The gate pulser 36 includes first, second, and third controlling parts that sequentially control[s] a combination of the switches 33 to 35 from (ON, OFF, OFF), to (OFF, ON, OFF), and (OFF, OFF, ON) respectively, and thereby, the negative voltage, the positive voltage, and the ground potential are applied to an output terminal of the pulse power supply 21.

Figure 4:
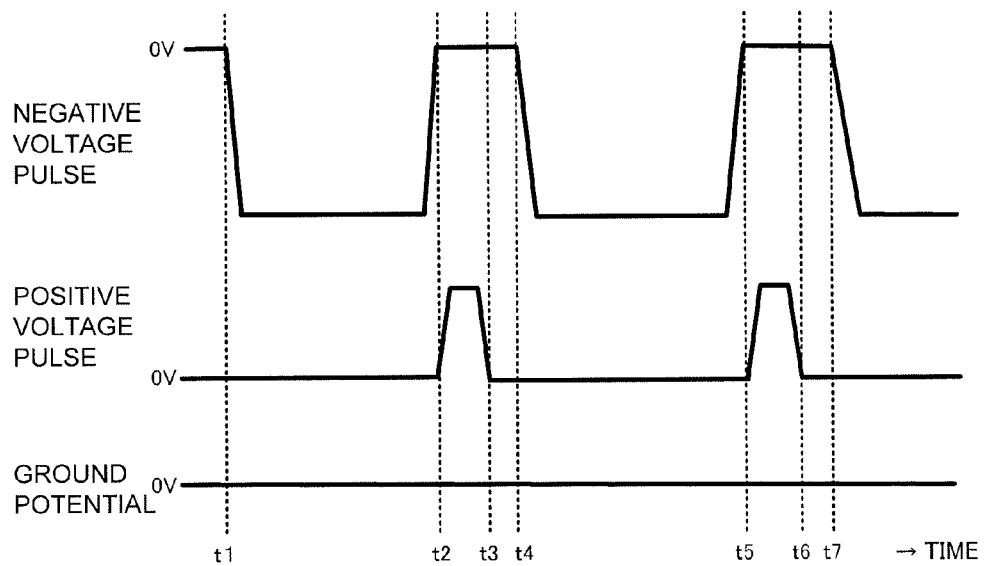
FIG. 4 is a view illustrating a state in which the combined pulse waveform is discomposed.

FIG. 4 illustrates a state in which the combined pulse waveform illustrated in FIG. 2 is decomposed into a negative voltage pulse waveform, a positive voltage pulse waveform, and the ground potential. The gate pulser 36 controls the switches 33 to 35, and thereby, the negative voltage pulse, the positive voltage pulse, and the ground potential are respectively output from the pulse power supply 21 at times t1 to t2, t2 to t3, and t3 to t4. The negative voltage pulse, the positive voltage pulse, and the ground potential are similarly output from the pulse power supply 21 respectively at times t4 to t5, t5 to t6, and t6 to t7.

The LPF (Low Pass Filter) 20 prevents that the radio frequency from the RF power supply 19 comes round to the pulse power supply 21, and outputs only a low frequency component from the voltage waveform input from the pulse power supply 21 to the lower electrode 16. As a result, the radio frequency from the RF power supply 19 and the combined pulse waveform from the pulse power supply 21 are superposed and applied to the lower electrode 16.

(Operations of Substrate Processing Apparatus)

The wafer 15 is transferred into the etching chamber 11 which is evacuated and reaches a predetermined pressure by a not-illustrated transfer mechanism. Next, the wafer 15 is held on the lower electrode 16 by the electrostatic chuck included by the lower electrode 16.

Next, the process gas required for the process of the wafer 15 is introduced from the process gas introducing pipe 12.

At this time, the process gas introduced into the etching chamber 11 is exhausted from the exhaust port 17 at a predetermined rate by the not-illustrated pressure regulating valve and exhaust pump. As a result, the pressure inside the etching chamber 11 is kept constant.

Next, the RF is applied from the RF power supply 19 to the lower electrode 16 via the matching device 18. Besides, the combined pulse waveform illustrated in FIG. 2 is superposed on the RF and applied to the lower electrode 16 from the pulse power supply 21.

A plasma density is controlled by RF power from the RF power supply 19. Incident energy of ions incident on the wafer 15 is controlled by the voltage of the negative voltage pulse from the pulse power supply 21. The wafer 15 is etched by the ions having energy of a threshold value or more of the process of the wafer 15.

A. Frequency of RF Voltage

As stated above, the frequency of the RF power supply 19 is 50 MHz or more. Hereinafter, reasons thereof are described. The frequency of the RF power supply 19 is set to be 50 MHz or more, and it has the following advantages of (1) and (2).

(1) Control of Average Incident Energy Vdc of Ions Only by Negative Voltage Pulse As stated above, the RF voltage and the combined voltage pulse are superposed and applied to the lower electrode 16. The plasma 14 is generated between the lower electrode 16 and the upper electrode 13 by the RF voltage. A positive ion in the plasma 14 is incident on the wafer 15, and the wafer 15 is processed. At this time, an average incident energy Vdc of the incident positive ion can be divided into a component Vdc1 resulting from the RF voltage and a component Vdc2 resulting from the negative voltage pulse.

Here, the component Vdc1 decreases as the frequency of the RF voltage increases. In particular, the component Vdc1 becomes approximately 50 eV (a threshold value which does not affect on the process of the wafer 15) or less when the RF power is approximately 2.2 W/cm$^2$ or less and the RF frequency exceeds 50 MHz. Besides, RF power dependence on the component Vdc1 becomes extremely small when the RF power exceeds 2.2 W/cm$^2$.

Accordingly, the average incident energy Vdc depends only on the negative voltage pulse without depending on the RF voltage by setting the RF frequency at 50 MHz or more. In other words, it is possible to control the average incident energy Vdc only by the negative voltage pulse. As a result, high-accuracy process by the ions with narrow-band energy generated by the negative pulse becomes possible as described later.

Note that a reason why the RF voltage is applied to the lower electrode 16 is to effectively generate the plasma. It is possible to effectively generate the plasma and to process the wafer 15 even when an insulating film is deposited on the wafer 15.

(2) Narrowing Band Width of Incident Energy Distribution of Ions

As it is illustrated below, it is practically possible to process the wafer 15 effectively and with high accuracy by the ions with a single energy peak by increasing the frequency of the RF voltage.

In general, there are a lower energy side peak P1 and a higher energy side peak P2 in a distribution of the ion energy in the plasma 14. It is because the plasma 14 is generated by the RF voltage. An energy width $\Delta E$ between the peaks P1, P2 depends on plasma generation conditions, and it is from several dozens [eV] to several hundreds [eV]. Accordingly, there are the ions of which energy is too high (higher energy side peak) and the ions of which energy is too low (lower energy side peak) in the ions incident on the wafer 15 even when the average incident energy Vdc is adjusted to be an optimum value for the process of the wafer 15.

There is a possibility in which process accuracy becomes insufficient if the wafer 15 is processed by the ions having two energy distributions as stated above. For example, there is a possibility in which shoulder cutting (facetting) occurs at a processed groove when the wafer 15 is processed by the ions at the higher energy side peak. On the other hand, there is a possibility in which the ions do not contribute to the process because they are a surface reaction threshold value or less, or anisotropy of the process deteriorates (an ion incident angle widens by a thermal velocity) when the wafer 15 is processed by the ions at the lower energy side peak.

An energy width $\Delta Ei$ decreases as the frequency of the RF voltage increases. Accordingly, the band width of the ion incident energy distribution is narrowed by increasing the frequency of the RF voltage, particularly setting to be 50 MHz or more. As a result, it is possible to practically process the wafer 15 by the ions having the single energy peak. Namely, the RF with the frequency of 50 MHz or more does not practically generate the ions having excess energy.

B. Generation of Charge Up at Bottom Part and so on of Groove

Hereinafter, an effect of applying the positive voltage pulse is described. At first, a case when only the negative voltage pulse is applied without applying the positive voltage pulse is described.

When a deep shape (deep groove, deep hole) or a complicated shape (three-dimensional shape) is formed at an insulating film on the wafer 15, a charge up is generated particularly inside the groove only by applying the RF voltage and the negative voltage pulse (without applying the positive voltage pulse). The charge up inside the groove becomes a cause lowering process accuracy of the groove. Hereinafter, a generation reason of the charge up is described.

Figure 5:
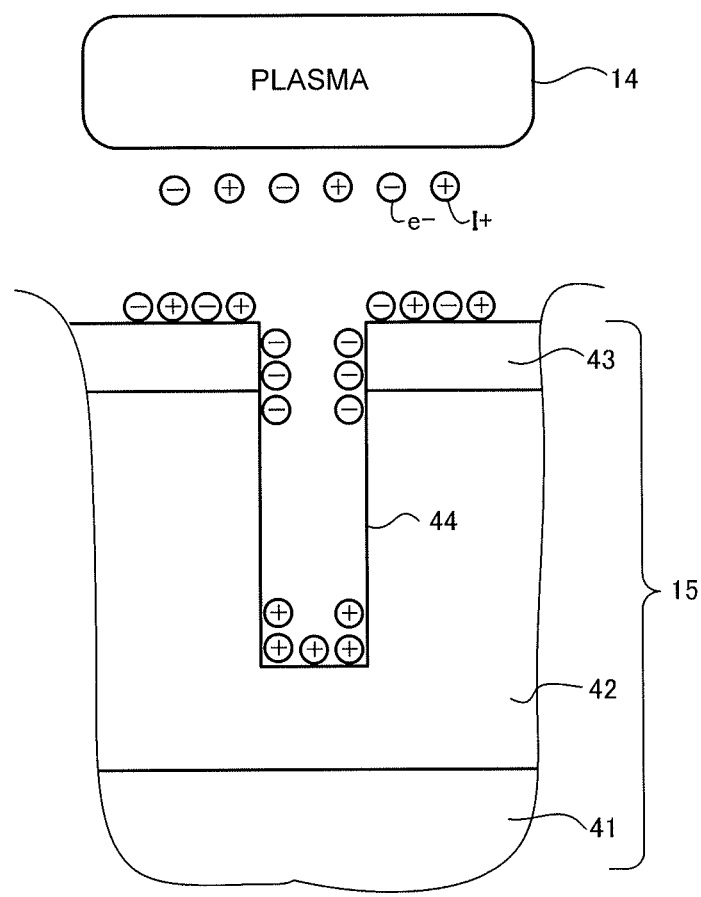
FIG. 5 is a sectional view illustrating a state in which a wafer 15 is processed.

FIG. 5 is a sectional view illustrating a state in which the wafer 15 is processed. Here, the wafer 15 is a laminated body of a substrate 41 and an insulator 42, and a groove 44 is formed by using a mask 43. It is possible to respectively use, for example, Si, SiOC, and $Si_3N_4$ (silicon nitride) for the substrate 41, the insulator 42, and the mask 43.

There are positive ions $I^+$ and electrons e in the plasma, and both of them are incident toward the substrate 41. The same numbers of positive ions $I^+$ and electrons e come flying at an outer surface of the groove 44 within one cycle of the negative pulse, and there is a tendency that they are electrically neutralized. On the other hand, there is a tendency that an inner surface of the groove 44 of which width is narrow and aspect ratio is large is charged up (charge). The electrons e and the positive ions $I^+$ are unevenly distributed at each of a sidewall in a vicinity of an entrance and in a vicinity of the bottom part of the groove 44, and it is charged to negative and positive.

A reason why the charge up is easy to occur at the inner surface of the groove 44 is because the positive ions $I^+$ are anisotropy and the electrons $e^-$ are isotropy. The positive ions $I^+$ are accelerated in a direction of the substrate 41 by the negative voltage pulse, and the directions thereof are aligned (anisotropy). On the other hand, the electrons e are not accelerated in the direction of the substrate 41, and the directions go to pieces (isotropy). The isotropic electrons $e^-$ are difficult to enter deep in the groove of which width is narrow, and the sidewall in the vicinity of the entrance of the groove 44 is charged up into a negative side. The negative charge up acts on the electrons e to keep them away, and therefore, the electrons $e^-$ incident on the bottom part of the groove 44 more decrease, and the bottom part of the groove 44 is charged up to a positive side caused by the incident of the anisotropic positive ions $I^+$. As stated above, it is assumed here that the positive voltage pulse is not applied.

Further, the number of the positive ions $I^+$ reach the bottom part of the groove 44 decreases caused by the positive charge up occurred at the bottom part of the groove 44, and traces of the positive ions $I^+$ are bent. Accordingly, a desired process becomes difficult because the process may be stopped (etching stop) and an abnormal state of a process shape (for example, notching: an abnormal etching occurred at a side surface of the bottom part of the groove 44) occurs.

The negative voltage pulse is applied to the lower electrode 16, and the positive ions $I^+$ are incident on the substrate 41, and thereby, the charge up at the bottom part of the groove 44 is incurred. Accordingly, it is possible to reduce the charge up by providing a period when the negative voltage pulse is not applied to the lower electrode 16 (quiescent period). However, there is a possibility that quiescent for a long time is required and a process rate is lowered caused by a time constant of relaxation of charge (rebalance of electrons).

C. Relaxation of Charge Up by Applying Positive Voltage Pulse (Generation of Anisotropic Electrons)

In the present embodiment, it becomes possible to reduce the charge up in a short time by applying the positive voltage pulse in addition to the negative voltage pulse.

Figure 6:
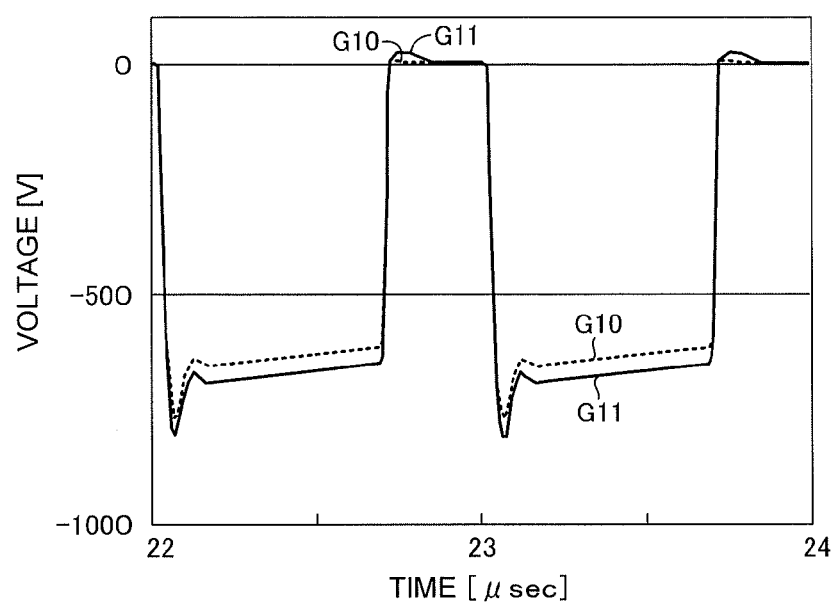
FIG. 6 is a graphic chart illustrating an example of a temporal change of a voltage on the wafer 15.
Figure 7:
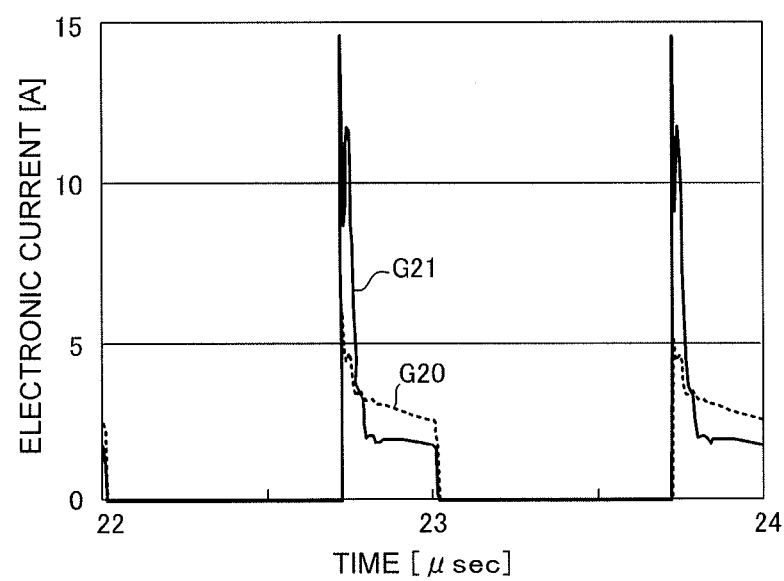
FIG. 7 is a graphic chart illustrating an example of a temporal change of an electronic current flowing at the wafer 15.

FIG. 6 is a graphic chart illustrating an example of a temporal change of voltages on the wafer 15. Here, the voltages are represented while using an electric potential at the upper electrode 13 as a reference. Besides, FIG. 7 is a graphic chart illustrating a temporal change of an electronic current flowing at the wafer 15. In FIG. 6 and FIG. 7, graphs G10, G20 correspond to a case when only the RF voltage and the negative voltage pulse are applied to the lower electrode 16. Besides, graphs G11, G21 correspond to a case when the RF voltage and the combined pulse waveform (the negative voltage pulse and the positive voltage pulse) are applied to the lower electrode 16. In this example, the positive voltage pulse has a peak voltage of 50 V, and a pulse width of 1% of a combined pulse cycle (duty ratio of 1%).

When the graphs G10, G11 are compared, it turns out that a peak of the positive voltage occurs just after the application of the positive voltage pulse with corresponding to the application of the positive voltage pulse. When the graphs G20, G21 are compared, it turns out that a peak of the electronic current increases just after the application of the positive voltage pulse with corresponding to the application of the positive voltage pulse, and the electronic current after the peak decreases. Namely, integral values of the electronic currents are approximately the same in the graphs G20, G21.

A reason why the integral values of the electronic currents are the same in the graphs G20, G21 can be described as follows. When a pulse waveform is repeatedly applied on an insulating film surface, an ion current and the electronic current on the wafer 15 are matched and equalized in one cycle. Namely, a direct current component in one cycle becomes "0" (zero) in a steady state in which an electric charge amount (charge up amount) on the wafer 15 becomes steady. In the graphs G20, G21, there is no practical difference in incident ion amounts (a state of the plasma 14 is actually dominated by the RF, and it is seldom affected by the positive voltage pulse), and therefore, the integral values of the electronic currents in one cycle become approximately the same.

The peak of the electronic current is generated just after the application completion of the negative voltage pulse in each of the graphs G20, G21. This can be described as follows. Namely, a mass of the electron is small, and it is difficult to be incident on the wafer during the application of the negative pulse. Accordingly, the electrons are intensively incident on the wafer 15 just after the application of the negative voltage pulse (at an instant when the voltage becomes large) to match the ion current and the electronic current in one pulse cycle.

As stated above, presence and absence of anisotropy of the ions and electrons are different when the positive voltage pulse is not applied. Accordingly, it is charged up to the positive side because the ions are incident but the electrons are difficult to be incident at the bottom parts of the groove and the hole where an aspect ratio is high. It is necessary to decrease the ion current to the bottom part of the groove (hole) or to increase the electronic current to the bottom part of the groove (hole) to relax a charge up distribution balanced at this state. The former one is not preferable because the process rate is lowered, and therefore, the latter one is employed.

It is necessary to apply a positive potential to the wafer 15 and to create anisotropic electrons to increase the electronic current to the bottom part of the groove (hole) as stated above.

Here, the integral value of the electronic current in itself does not much change even if the positive voltage pulse is applied as stated above, and therefore, an index evaluating a contribution to reduce the charge up at the bottom parts of the groove and the hole becomes necessary. This index is set to be an effective electric energy Ee. The effective electric energy Ee is defined by the following expression (1).

$$Ee = \int_0^T Pe(t)dt = \int_0^T Ie(t) \cdot V(t)dt \quad \text{Expression (1)}$$

T: cycle of combined pulse
Ie(t): electronic current
V(t): voltage applied to wafer 15
Pe(t): effective electric power The effective electric energy Ee is an integral value of the effective electric power Pe (a product of the voltage V(t) and the electronic current Ie(t)). It is conceivable that the electronic current during a period when the positive potential is applied to the wafer 15 has the anisotropy, and contributes to the relaxation of the charge up in the groove (positive charge up at the bottom of the groove). Hereinafter, the relaxation of the charge up is evaluated by using the effective electric energy Ee.

D. Duty Ratio of Positive Voltage Pulse

An effect of the pulse width (duty ratio) of the positive voltage pulse is considered. Here, the positive voltage pulse is a peak voltage at 500 V, and the duty ratio D (a ratio of a pulse width ΔT occupying in a cycle T of the combined pulse (D=ΔT/T)) is changed to be "0" (zero) %, 0.1%, 1%, 5%, 10% and 20% (respectively correspond to graphs D0, D0.1, D1, D5, D10, D20 in FIG. 8 to FIG. 12). The duty ratio D="0" (zero) % means that the positive voltage pulse is not applied.

Figure 8:
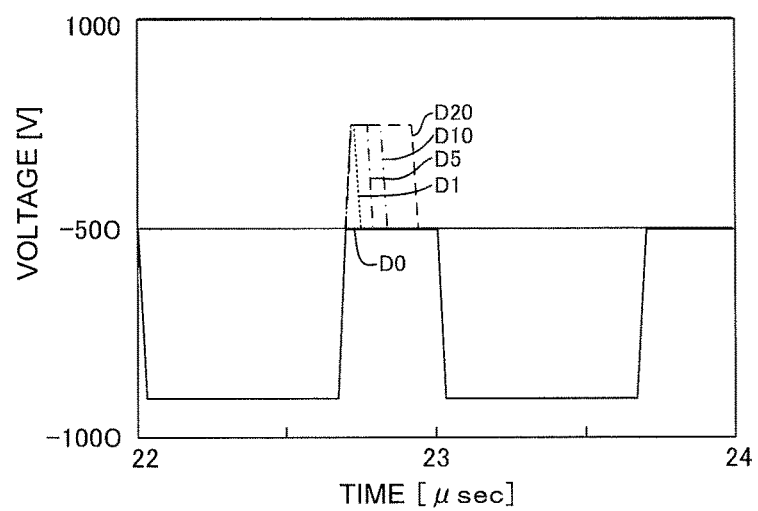
FIG. 8 is a graphic chart illustrating an example of the combined pulse waveform.
Figure 9:
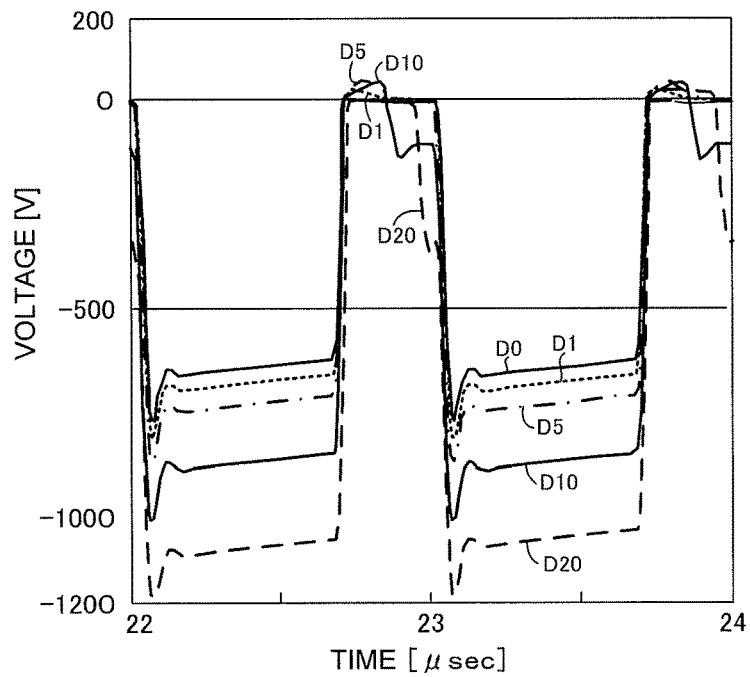
FIG. 9 is a graphic chart illustrating an example of a temporal change of the voltage on the wafer 15.
Figure 10:
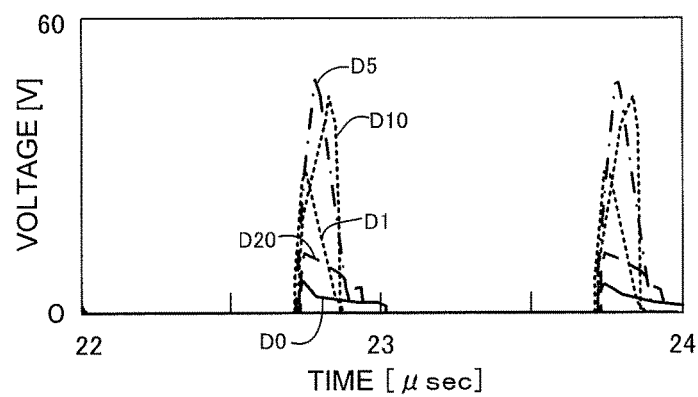
FIG. 10 is a graphic chart enlarging a part of FIG. 9.
Figure 11:
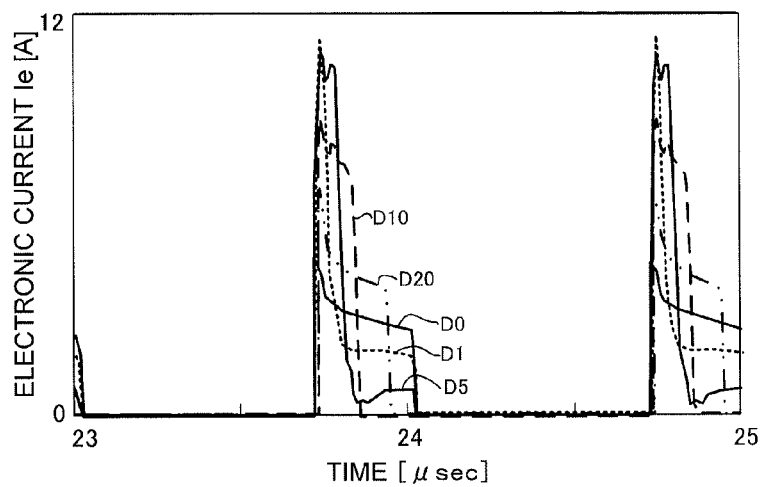
FIG. 11 is a graphic chart illustrating an example of a temporal change of the electronic current flowing at the wafer 15.

FIG. 8 is a graphic chart illustrating a combined pulse waveform at this time. FIG. 9 and FIG. 10 are graphic charts illustrating temporal changes of the voltages (voltage V(t)) on the wafer 15 at this time. FIG. 10 illustrates a part of FIG. 9 with expansion. FIG. 11 is a graphic chart illustrating a temporal change of the electronic current (the electronic current Ie(t)) flowing at the wafer 15 at this time. Note that a case when the duty ratio is 0.1% is excluded in FIG. 8 to FIG. 11 for easy to understanding.

Figure 12:
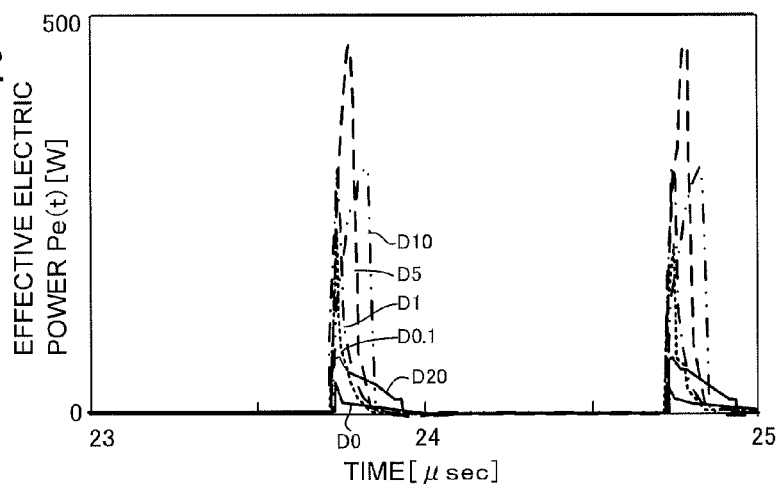
FIG. 12 is a graphic chart illustrating an example of a temporal change of an effective electric power Pe(t).
Figure 13:
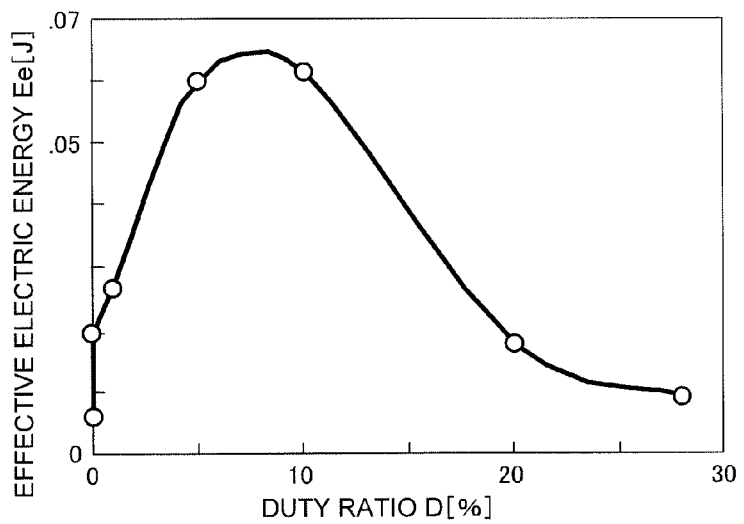
FIG. 13 is a graphic chart illustrating an example of a correspondence between an effective electric energy Ee and a duty ratio D.

As illustrated in FIG. 10 and FIG. 11, the positive voltage added on the wafer 15 becomes large and the electronic current also becomes large when the duty ratio is small compared to a case when the duty ratio is large. FIG. 12 is a graphic chart illustrating a temporal change of the effective electric power Pe(t) at this time. The effective electric power Pe(t) is calculated by multiplying the voltage V(t) and the electronic current Ie(t) illustrated in FIG. 9 and FIG. 11. FIG. 13 is a graphic chart illustrating a correspondence between the effective electric energy Ee and the duty ratio D.

As illustrated in FIG. 13, the effective electric energy Ee changes largely depending on the presence/absence of the application of the positive voltage pulse. When the positive voltage pulse is not applied (duty ratio D="0" (zero) %), the effective electric energy Ee is approximately $0.6 \times 10^{-2}$ [J]. On the other hand, when the positive voltage pulse is slightly applied (duty ratio=0.1%), the effective electric energy Ee is approximately $2.0 \times 10^{-2}$ [J]. Namely, the effective electric energy Ee increases approximately three times depending on the presence/absence of the application of the positive voltage pulse. When the duty ratios are 5% and 10%, the effective electric energies Ee are approximately $6.0 \times 10^{-2}$ [J] and increase approximately ten times compared to the case when the positive voltage pulse is not applied (duty ratio is "0" (zero) %).

On the other hand, there is a tendency in which the effective electric energy Ee is lowered when the duty ratio becomes larger than a certain degree or more. Namely, there is an upper limit in a proper value of the duty ratio. It is possible to use 0.1% to 20% as the duty ratio. It is possible to use approximately 1% to 18% as a more preferable duty ratio, and approximately 3% to 13% as a further preferable duty ratio.

E. Application Timing of Positive Voltage Pulse

Figure 14:
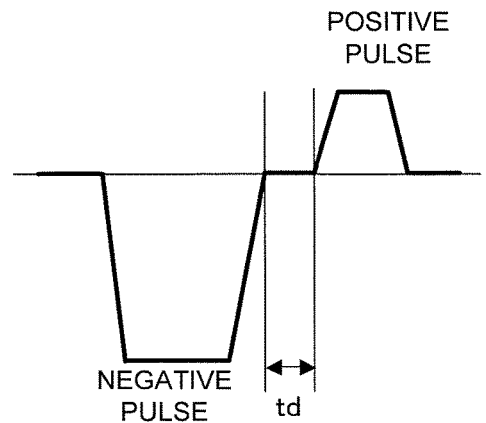
FIG. 14 is a schematic diagram illustrating a delay time.

Next, an effect of a delay time td from the application of the negative voltage pulse to the application of the positive voltage pulse is considered. FIG. 14 is a schematic diagram illustrating the delay time. A time from the time when the application of the negative voltage pulse is finished and the lower electrode 16 becomes the ground potential to the time when the application of the positive voltage pulse is started is the delay time td.

Here, the delay time is changed to be "0" (zero) ns, 50 ns, 150 ns, and 250 ns. Note that the duty ratio is 1%, a cycle T0 is 1 [μsec], and the negative pulse application time is 700 [ns].

Figure 15:
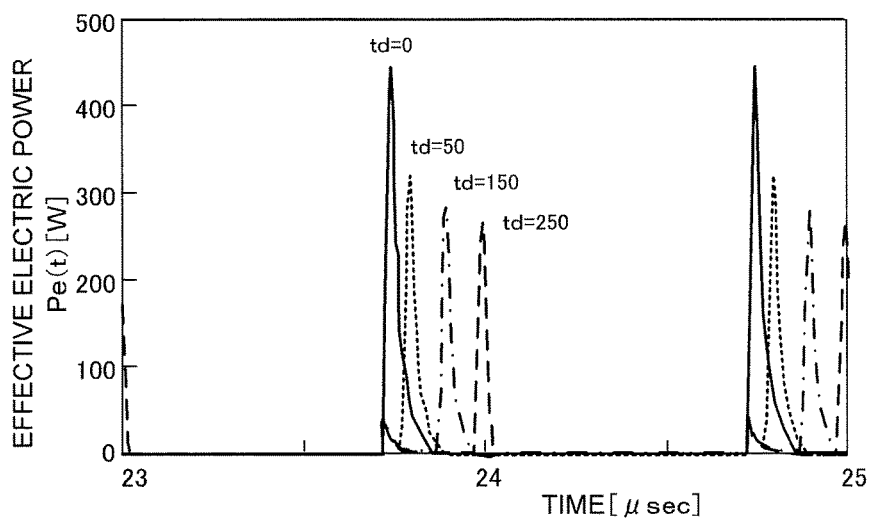
FIG. 15 is a graphic chart illustrating an example of a temporal change of the effective electric power Pe(t).
Figure 16:
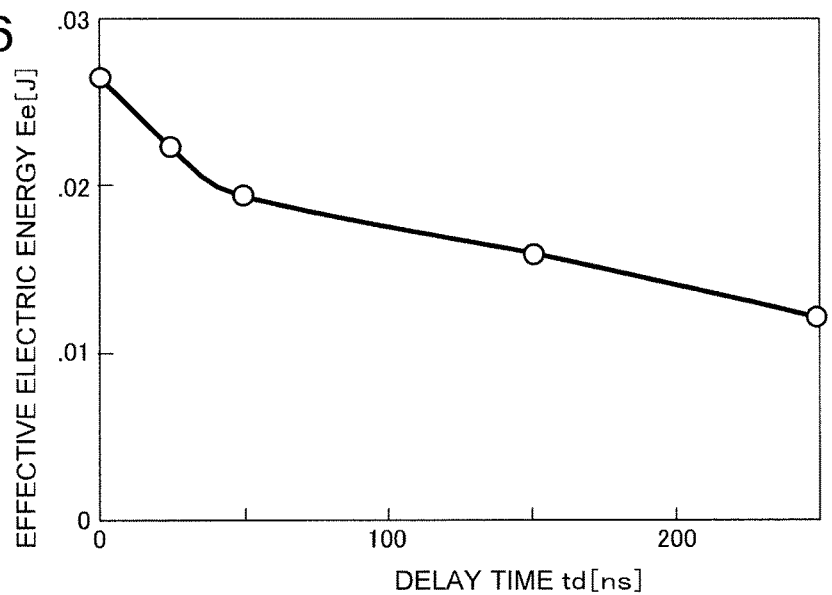
FIG. 16 is a graphic chart illustrating an example of a correspondence between the effective electric power Ee and a delay time td.

FIG. 15 is a graphic chart illustrating a temporal change of the effective electric power Pe(t) at this time. As stated above, the effective electric power Pe(t) is calculated by multiplying the voltage V(t) and the electronic current Ie(t). FIG. 16 is a graphic chart illustrating a correspondence between the effective electric power Ee and the delay time td.

As illustrated in FIG. 16, it is good when the delay time is 50 ns or less, particularly at the time just after the application of the negative voltage pulse (delay time is "0" (zero) ns). When it is set to be just after the application of the negative voltage pulse, the effective electric energy Ee becomes as large as approximately two times compared to a case when the application delays largely (delay time is 250 ns). As stated above, a total amount (integral amount) of the electronic current is defined, and the peak of the electronic current is generated just after the application of the negative voltage pulse even if the positive voltage pulse is not applied. The inflow electrons when the positive voltage pulse is not applied are basically isotropy, and therefore, a ratio of the anisotropic electronic current occupying in the total amount of the electronic current becomes small if the application of the positive voltage pulse delays.

F. Application of Plural Positive Voltage Pulses

It is also possible to make the combined pulse as a combination of the negative voltage pulse and plural positive voltage pulses. Here, the number of the positive voltage pulses N is changed from "0" (zero) to six. Note that the number N="0" (zero) means that the positive voltage pulse is not applied. At this time, the duty ratio (total duty ratio) Dt in a whole of the positive voltage pulses is made constant (0.5%, 1%). Namely, the duty ratio D per one positive voltage pulse decreases in accordance with the number of the positive voltage pulses N (D=Dt/N).

Figure 17:
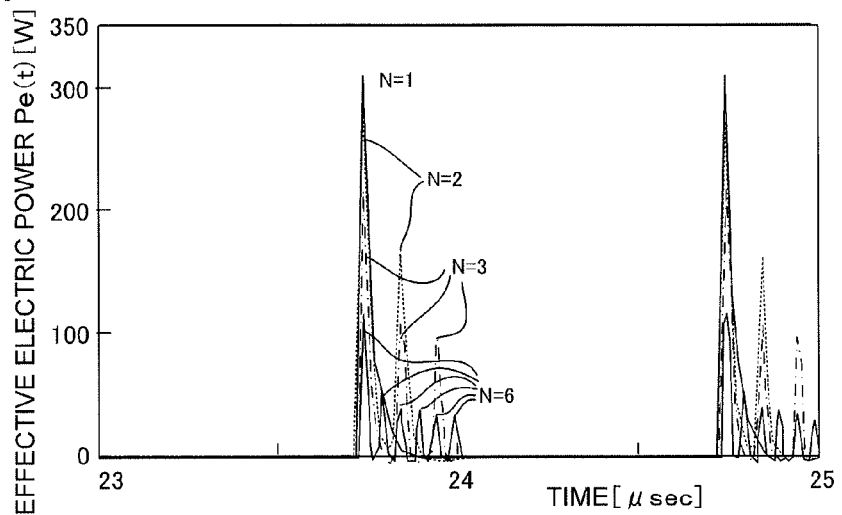
FIG. 17 is a graphic chart illustrating an example of a temporal change of the effective electric power Pe(t).
Figure 18:
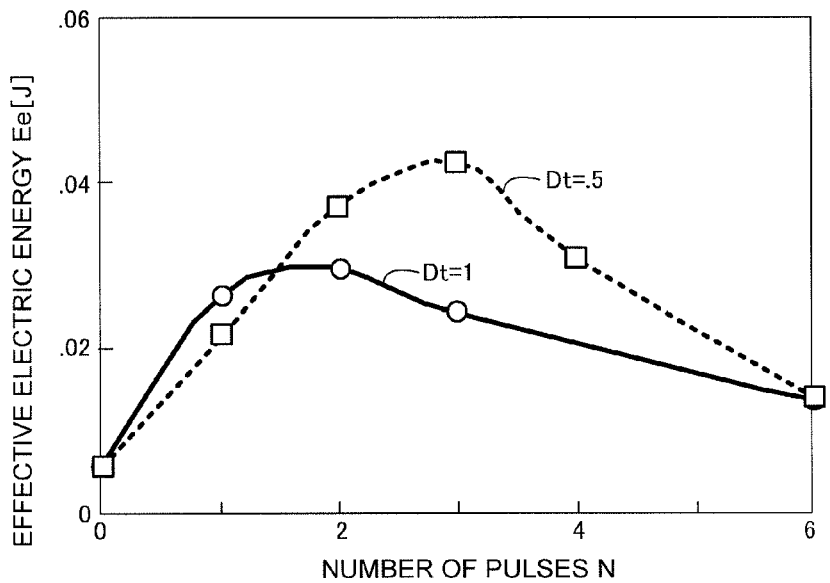
FIG. 18 is a graphic chart illustrating an example of a correspondence between the effective electric energy Ee and the number of positive voltage pulses N.

FIG. 17 is a graphic chart illustrating a temporal change of the effective electric power Pe(t) at this time. As stated above, the effective electric power Pe(t) is calculated by multiplying the voltage V(t) and the electronic current Ie(t). FIG. 18 is a graphic chart illustrating a correspondence between the effective electric energy Ee and the number of positive voltage pulses N.

As illustrated in FIG. 18, the effective electric energy Ee increases by dividing one positive voltage pulse into plural positive voltage pulses. When the total duty ratios Dt are respectively 0.5% and 1%, the effective electric energy Ee becomes maximum when the numbers of positive voltage pulses N are three and two.

As stated above, it is conceivable that a reason why the division of the positive voltage pulse is effective is that a suppression effect of the charge up by the positive voltage pulse decreases as time elapses (it is because the voltage on the wafer 15 decreases, namely, the anisotropy of the electrons decreases). The plural positive voltage pulses are divided and applied, and thereby, it is possible to recover the suppression effect of the charge up during quiescent periods between the plural positive voltage pulses.

Figure 19:
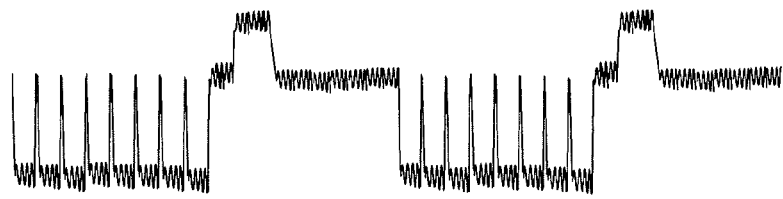
FIG. 19 is a view illustrating an example of the combined pulse waveform.

G. Application of Positive Voltage Pulse During Negative Voltage Pulse is Quiescent It is also possible to make the combined pulse as a combination of plural negative voltage pulses and a single positive voltage pulse. An example thereof is illustrated in FIG. 19. The negative voltage pulses are continuously applied, and the positive voltage pulse is applied during quiescent periods. In this drawing, a state in which the RF voltage is also superposed is illustrated. Note that it is also possible to repeat the combination of the negative voltage pulse and the positive voltage pulse instead of the continuous negative voltage pulses.

Other Embodiments

It should be noted that the present embodiment is not limited to the above-described embodiments as they are, and in an implementation stage, it can be embodied by modifying components thereof within a range not departing from the spirit of the invention. For example, it is possible to apply for a plasma CVD (Chemical Vapor Deposition) apparatus and so on in addition to the RIE as the substrate processing apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus, comprising:
    a chamber;
    a first electrode disposed in the chamber;
    a second electrode disposed in the chamber to face the first electrode, and to hold a substrate;
    an RF power supply to apply an RF voltage with a frequency of 50 MHz or more to the second electrode;
    a first DC power supply to supply a negative voltage;
    a second DC power supply to supply a positive voltage;
    an output end connected to the second electrode;
    a first switch connecting the first power supply and the output end;
    a second switch connecting the second power supply and the output end;
    a third switch connecting the ground potential and the output end; and
    a gate pulser configured to sequentially control a combination of the first to third switches repeatedly to form a voltage waveform including a negative voltage pulse and a positive voltage pulse following the negative voltage pulse, and repeatedly apply said voltage waveform to the second electrode while superposing on the RF voltage applied to the second electrode,
    the negative voltage pulse having a negative peak voltage corresponding to the negative voltage, the positive voltage pulse having a positive peak voltage corresponding to the positive voltage, the positive voltage pulse having a delay time of 50 nano-seconds or less after the application of the negative voltage pulse,
    wherein a duty ratio of the positive voltage pulse is 1% or more and 18% or less, the duty ratio being defined by a ratio of a pulse width of the positive voltage pulse to a period of said voltage waveform.

2. The apparatus according to claim 1,
wherein the voltage waveform includes plural positive voltage pulses or plural negative voltage pulses.

3. The apparatus according to claim 2,
wherein the voltage waveform includes the negative voltage pulse and a plurality of the positive voltage pulses following the negative voltage pulse.

4. The apparatus according to claim 3,
wherein the voltage waveform does not include a negative voltage pulse in the period of continuing the positive voltage pulses.

5. The apparatus according to claim 2,
wherein the voltage waveform includes a plurality of the negative voltage pulses and the positive voltage pulse following the negative voltage pulses.

6. The apparatus according to claim 5,
wherein the voltage waveform does not include a positive voltage pulse in the period of continuing the negative voltage pulses.

7. The apparatus according to claim 1,
wherein the gate pulser includes:
    a first controlling part setting the first switch at a closed state, the second and third switches at open states to output the negative voltage pulse to the output end;
    a second controlling part setting the second switch at the closed state, the first and third switches at the open states to output the positive voltage pulse to the output end; and
    a third controlling part setting the third switch at the closed state, the first and second switches at the open states to output the ground potential to the output end.

8. The apparatus according to claim 1,
wherein the duty ratio is 3% or more and 13% or less.

* * * * *